(12) United States Patent
Celii et al.

(10) Patent No.: US 6,274,979 B1
(45) Date of Patent: Aug. 14, 2001

(54) ORGANIC LIGHT EMITTING DIODES

(75) Inventors: Francis G. Celii, Dallas; Simon J. Jacobs, Lucas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/156,166

(22) Filed: Sep. 17, 1998

Related U.S. Application Data

(60) Provisional application No. 60/059,199, filed on Sep. 17, 1997.

(51) Int. Cl.[7] ............................. H01J 63/04; H01J 1/62
(52) U.S. Cl. ............................................ 313/506; 313/498
(58) Field of Search ...................................... 313/498–506

(56) References Cited

U.S. PATENT DOCUMENTS

| | | | |
|---|---|---|---|
| 5,652,067 | * | 7/1997 | Ito et al. ................................ 428/690 |
| 5,776,622 | * | 7/1998 | Hung et al. ............................ 428/690 |
| 5,776,623 | * | 7/1998 | Hung et al. ............................ 428/690 |

* cited by examiner

*Primary Examiner*—Ashok Patel
*Assistant Examiner*—Matthew J. Geribe
(74) *Attorney, Agent, or Firm*—Carlton H. Hoel; W. James Brady; Frederick J. Telecky, Jr.

(57) ABSTRACT

An organic light emitting diode with dielectric barriers (120, 106) at both the anode-organic and the cathode-organic interfaces.

7 Claims, 6 Drawing Sheets

ORGANIC LIGHT EMITTING DIODES

This application claims the benefit of Provisional No. 60/059,199 filed Sep. 17, 1997.

BACKGROUND OF THE INVENTION

The invention relates to electronic semiconductor devices, and, more particularly, to organic light emitting diode structures and fabrication methods.

Commercial light emitting diodes (LEDs) typically constitute a p-n junction of inorganic semiconductors, such as AlGaAs and GaAs; with the electron-hole recombination at the junction emitting a photon. In contrast, organic semiconductor LEDs (OLEDs) have various device structures with carrier recombination generating excitons (localized excited molecular states) which then lead to luminescence by the organic material. Rothberg and Lovinger, Status of and Prospects for Organic Electroluminescence, 11 J.Mat.Res. 3174 (1996) review current OLEDs and illustrate typical device structures in the form of a stack of thin layers with transverse current flow; the stack may be a transparent substrate (glass), a transparent anode (indium-tin oxide), a hole transport layer (TPD), an emissive layer which also is an electron transport layer and in which electron-hole recombination and luminescence occur (Alq3), and a cathode (Mg:Ag). TPD is N,N'-diphenyl-N,N'-(3-methylphenyl)-1,1-biphenyl-4,4'-diamine and Alq3 is tris-8-hydroxyquinoline aluminum. The organic materials may be amorphous or polycrystalline discrete molecular or may be polymeric. Polymer layers differ from discrete molecular layers in that they are not deposited by vacuum vapor deposition, but rather by spin coating from an appropriate solvent. The polymeric layer may also be deposited (either by vapor deposition or spin coating) as prepolymer layers and then converted either thermally or photochemically to the active form.

FIG. 2b is a nominal energy level diagram for this device structure during operation; LUMO stands for lowest unoccupied molecular orbital and in a sense corresponds to a conduction band edge for an inorganic semiconductor, HOMO for highest occupied molecular orbital and corresponds to the valence band edge for an inorganic semiconductor, $\Phi_c$ the cathode work function, and $V_{appl}$ the applied voltage. In the usual case, the LUMO discontinuity from the electron transport layer to the hole transport layer is greater than the HOMO discontinuity in the opposite direction, so holes from the hole transport layer inject into the emitter layer and recombine with electrons to form excitons which excite the emitter layer to luminesce.

Huang et al, Enhanced Electron Injection in Organic Electroluminescence Devices Using an Al/LiF Electrode, 70 Appl.Phys.Lett. 152 (1997), report an OLED with a cathode of Al on a thin (0.5–1.0 nm) layer of LiF on the Alq3 emissive layer with a NPB hole transport layer plus a buffer of CuPc on the indium-tin oxide anode. NPB is N,N'-bis(1-napthyl)-N,N'-diphenyl-1,1'-biphenyl-4,4'-diamine and CuPc is copper phthalocyanine. The LiF barrier in the cathode seemingly provides band bending (LUMO level) in the Alq3 at the interface and thereby lowers the barrier height to electron injection into the Alq3 (the electrons tunnel through the LiF).

Dodabalapur et al, 30 Electron. Lett. 1000 (1994) describe a microcavity LED design to achieve full color and pixelation for OLEDs. Lithographic patterning of an inert filler layer is used in conjunction with a white organic emitter to derive red, green and blue light from a single electrical structure: electromagnetic boundary conditions enhance molecular emission of particular colors along the cavity normal which prescribes the color and leads to much higher efficiency than obtained with filters.

U.S. Pat. No. 5,656,508 shows integration of an array of OLEDs.

SUMMARY OF THE INVENTION

The present invention provides an organic semiconductor light emitting diode (OLED) with dielectric barriers at both the anode-organic and cathode-organic interfaces.

This has the advantages of increased carrier injection efficiency and increased overall OLED efficiency plus lower voltage operation.

BRIEF DESCRIPTION OF THE DRAWINGS

The drawings are heuristic for clarity.

DESCRIPTION OF THE PREFERRED EMBODIMENTS

Overview

The preferred embodiment OLEDs have thin high k inorganic tunneling barriers at both the interface of the anode and hole transport layer and at the interface of the cathode and the electron transport layer.

Preferred Embodiment OLEDs

Figure 1:
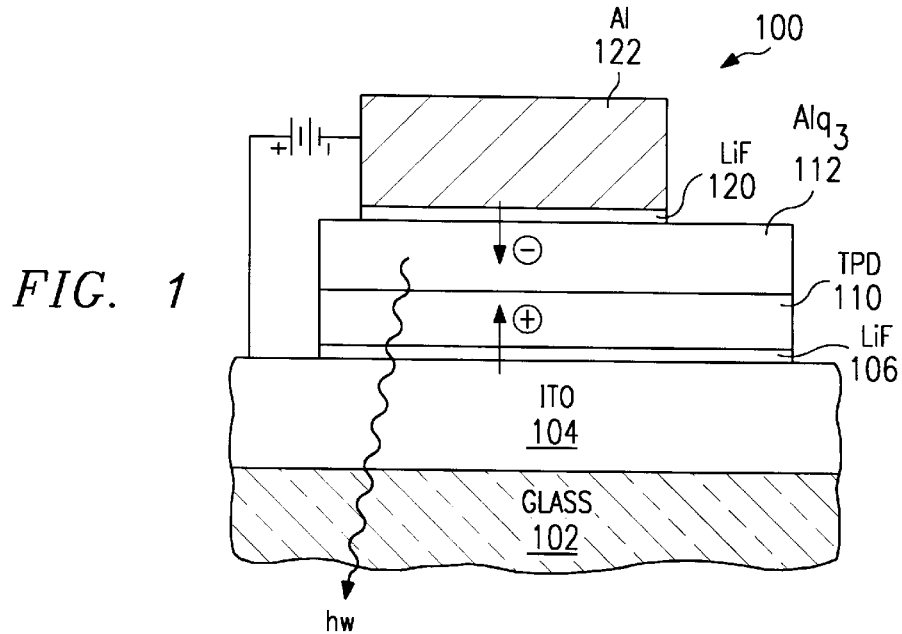
FIG. 1 is a cross sectional elevation views of a preferred embodiment organic light emitting device.
Figure 2A:
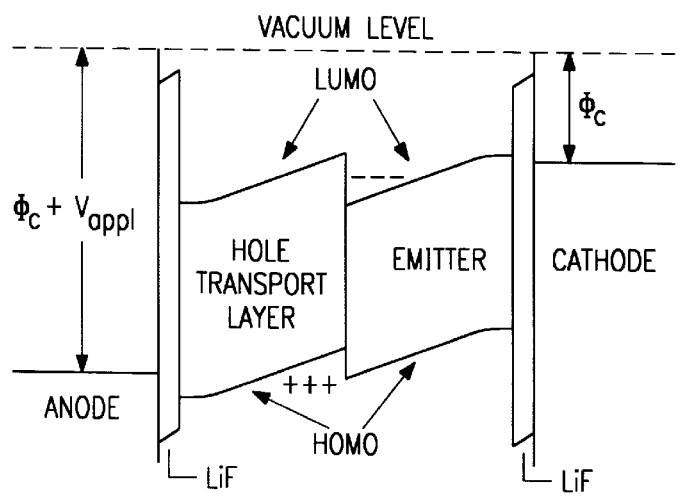
FIGS. 2a–b illustrates energy levels.
Figure 2B:
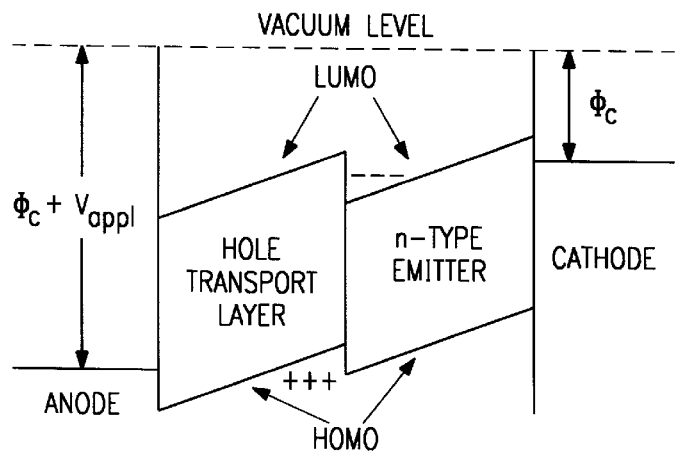

FIG. 1 illustrates in cross sectional elevation view first preferred embodiment OLED 100 as including transparent (glass) substrate 102, 120 nm thick indium-tin oxide anode layer 104, 1.5 nm thick LiF dielectric layer 106, 25 nm thick TPD hole transport layer 110, 75 nm thick undoped $Alq_3$ emissive layer 112, 1.5 nm thick LiF dielectric layer 120, and 200 nm thick aluminum cathode 122. The $Alq_3$ provides electron transport and is the emission medium. $Alq_3$ is tris-8-hydroxyquinoline aluminum, and TPD is N,N'-bis(3-methylphenyl)-N,N'-diphenyl-1,1'-biphenyl 4,4'-diamine. OLED 100 has an area of about 5 $mm^2$ and FIG. 1 exaggerates the vertical for clarity. FIG. 1 also heuristically indicates the electron and hole flow and an emitted photon. FIG. 2a is the energy level diagram during operation and includes band bending at the LiF-organic interfaces. OLED 100 provides green light.

All of the films may be evaporated onto the indium-tin oxide on glass substrate; and cathode metal patterns may be defined by shadow masks. Organic layer thicknesses may be measured using spectroscopic ellipsometry.

A second preferred embodiment OLED has the same structure as OLED 100 but replaces the undoped $Alq_3$ emissive layer with a doped $Alq_3$ emissive layer; the dopant may be a dye such as DCM (4-(dicyanomethylene)-2-methyl-6-(4-dimethylaminostyryl)-4H-pyran) or QAC (quinacridone). The dye dopant may be evaporated concurrently with the $Alq_3$ to further increase efficiency. The doped emissive layer provides green (QAC) or yellow (DCM) light. The preferred doping concentrations are on the order of 0–5%.

Experimental Results

Figure 3A:
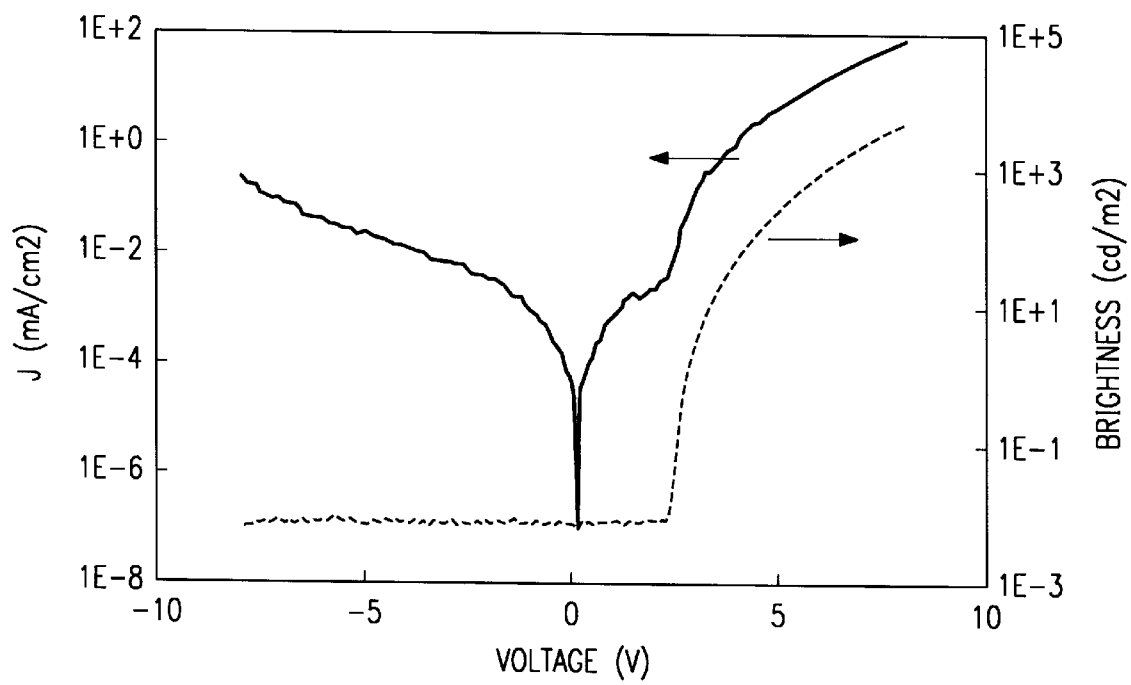
FIGS. 3a–b, 4, and 5 show experiemntal result of preferred embodiment devices.
Figure 3B:
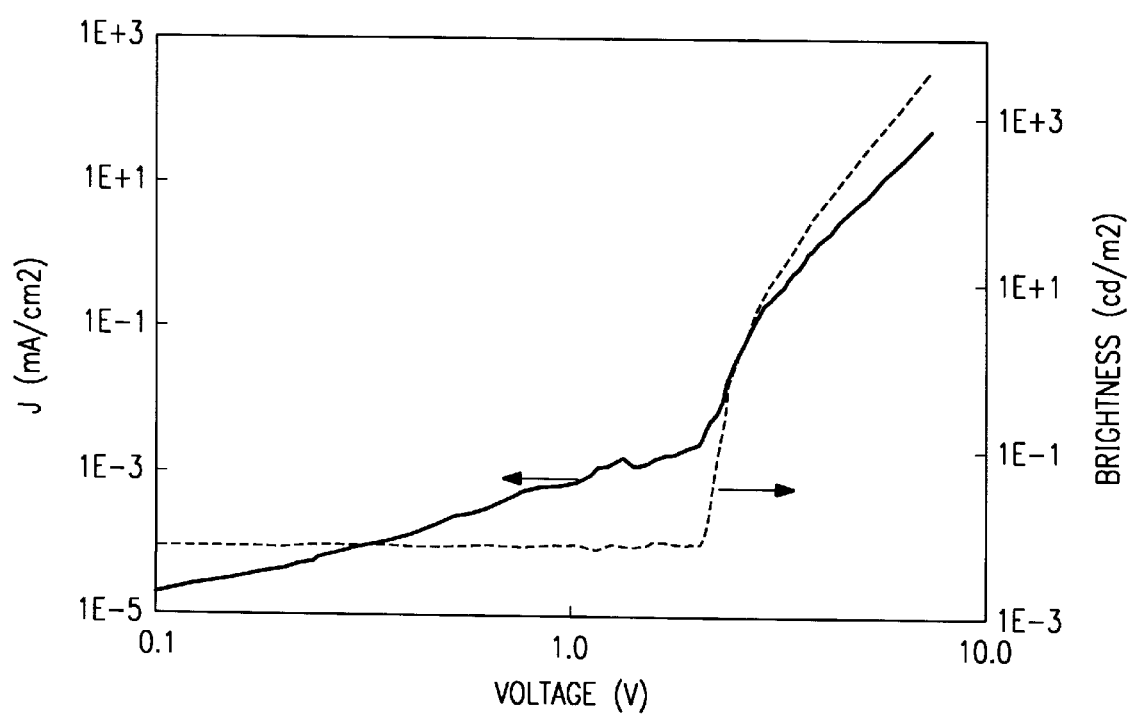

FIGS. 3a–b show experimental current-voltage curves for 5 mm$^2$ OLED 100 operated under DC bias. Display level brightness is achieved at approximately 4 volts, at efficiencies close to 4 lumens/watt. Current densities of 100 milliamps/cm$^2$ produce brightness up to 9000 candela/m$^2$. The devices support DC current densities up to 1.5 amps/cm$^2$ before dielectric breakdown, and peak brightnesses range from 50,000 to 75,000 cd/m$^2$. Current rectification ratios of 2000–5000 are typical. A plot of log(J) as a function of log(V) shows a near-linear region at low voltage, followed by a high-order ($\sim V^8$) power-law dependence at higher voltage; see FIG. 3b. This behavior is similar to that reported for a TPD/Alq$_3$ device, but the preferred embodiment's LiF dielectric layers yield a region of shallower slope at higher voltages.

Figure 4:
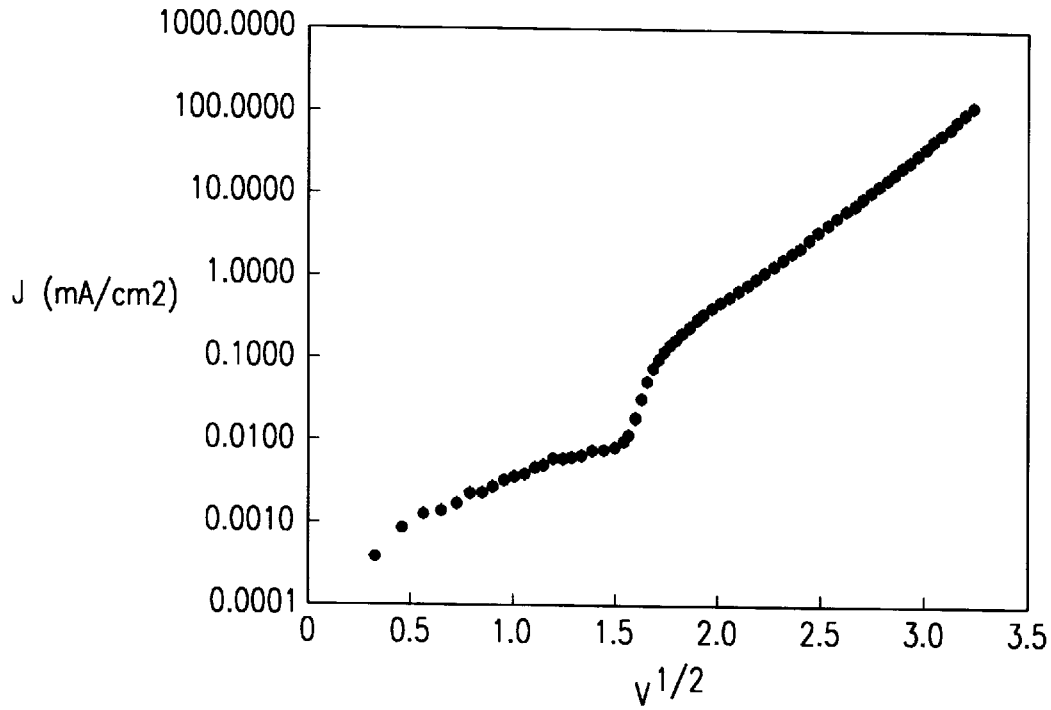

Schottky emission plots of log(J) as a function of $V^{1/2}$ are linear for some, but not all, devices; see FIG. 4.

Figure 5:
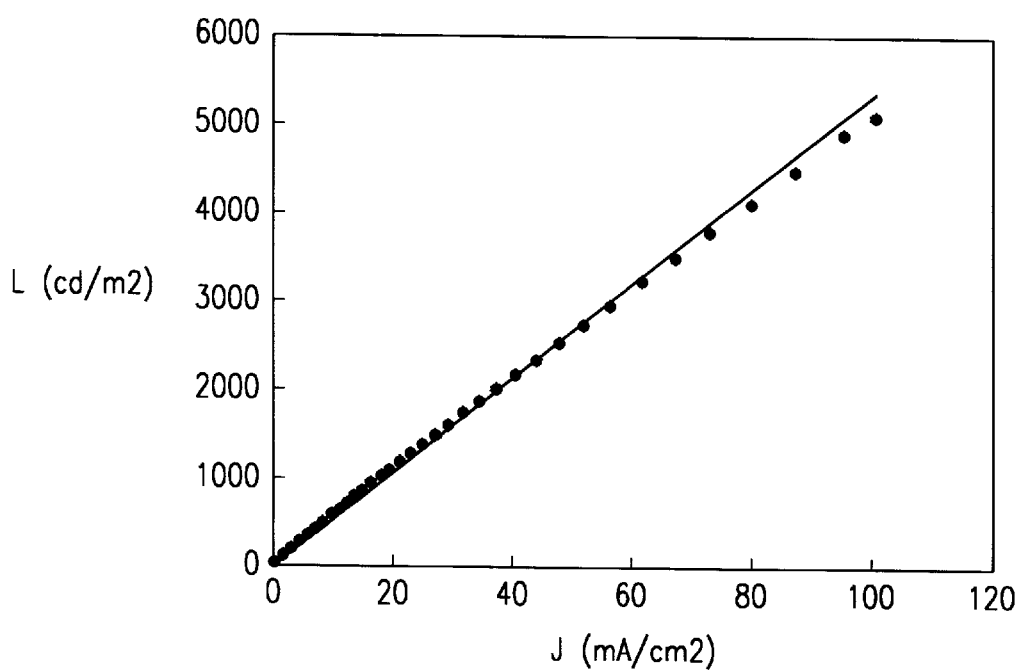

The slopes of the light output as a function of current density range from 5 to 8.87 cd/amp and depend strongly on the thickness of the organic layers. The light-current density behavior at higher current densities typically falls below this line as illustrated in FIG. 5. It is generally accepted that the efficiency of an OLED is determined by the product of photoluminescence quantum yield, a factor of 0.25 due to spin statistics (the probability of forming an emissive singlet state instead of a nonemissive triplet state), and a factor of $\frac{1}{2}n^2 = 0.222$ (for an index of refraction, n, of 1.5) due to optical losses (internal reflections). Presuming the photoluminescence quantum efficiency of Alq$_3$ is 0.32, then the external efficiency of an Alq$_3$ OLED should have a maximum external quantum efficiency of 1.78%. However, the preferred embodiment device with experimentally measured 8.87 cd/amp external efficiency corresponds to an external quantum efficiency of 2.83%.

Figure 6:
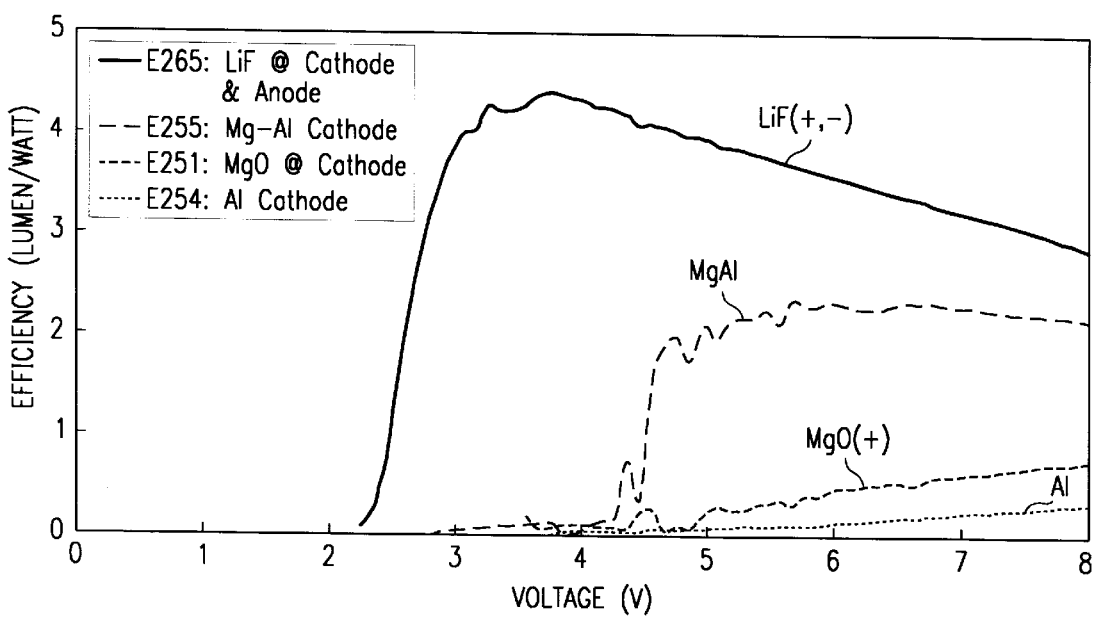
FIG. 6 compares performance of a preferred embodiment with other devices.

FIG. 6 shows a comparison of the efficiency of various OLED device structures, with and without inorganic dielectric layers. Clearly, the preferred embodiment ITO/LiF/TPD/Alq$_3$/LiF/Al devices are the most efficient by more than a factor of two, and the light turn-on voltage is significantly reduced. Band bending of the organics at the LiF interfaces may enhance charge injection efficiency and underlie the increased efficiency; see FIG. 2a. The efficiency depends somewhat on LiF thickness for thicknesses below 2.5 nm.

Figure 7:
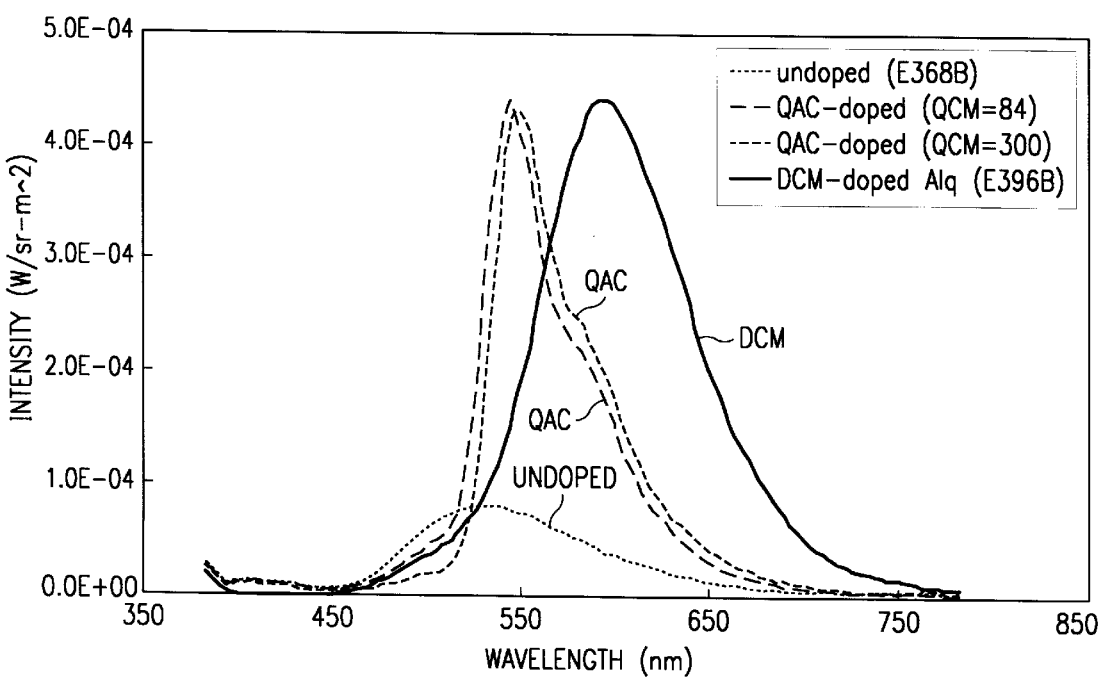
FIG. 7 shows performance of various embodiments.

FIG. 7 compares the effect of dye dopants in the Alq$_3$ emissive layer in the second preferred embodiment to the undoped Alq$_3$ of the first preferred embodiment. In particular, this photoluminescence analysis indicates that the doped Alq$_3$ is about 5 times as efficient as the undoped and with a narrower spectral band.

Figure 8:
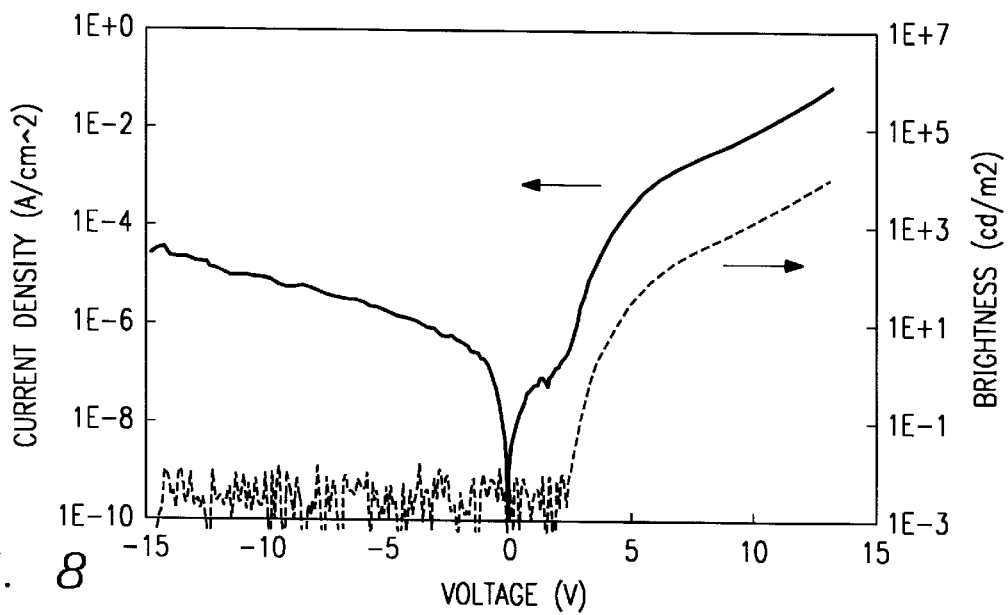
FIGS. 8–9 show electrical performance.
Figure 9:
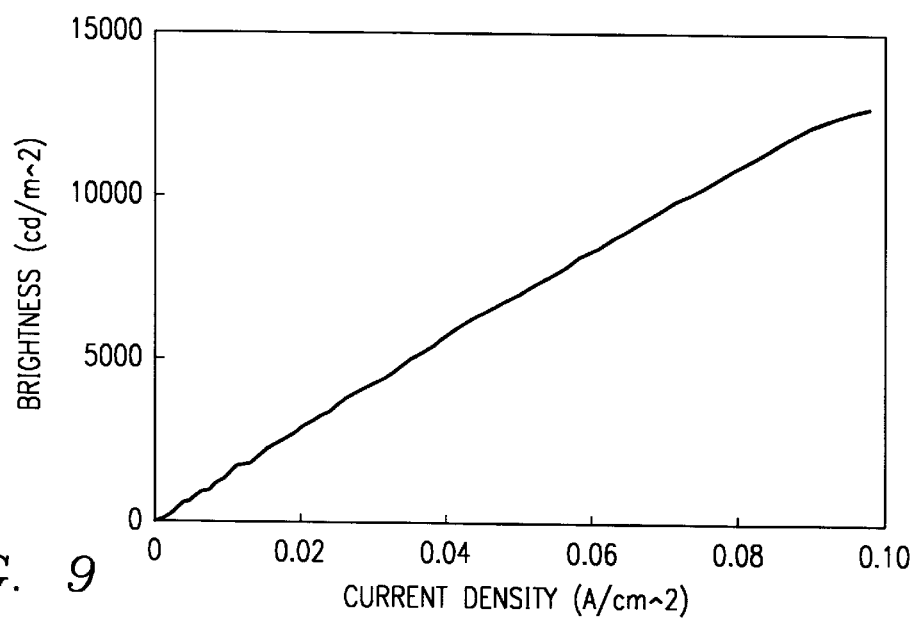

Display level brightness at over 6 lumens/watt can be achieved at 4–6 volts for the second preferred embodiment with about 1% QAC doping in the Alq$_3$. FIG. 8 shows current density and brightness as functions of diode voltage for the second preferred embodiment; and FIG. 9 shows the brightness as a function of current density with a power efficiency of about 14 cd/amp. These Figures are analogous to FIGS. 3a and 5 for the first preferred embodiment.

Application Preferred Embodiments

Figure 10:
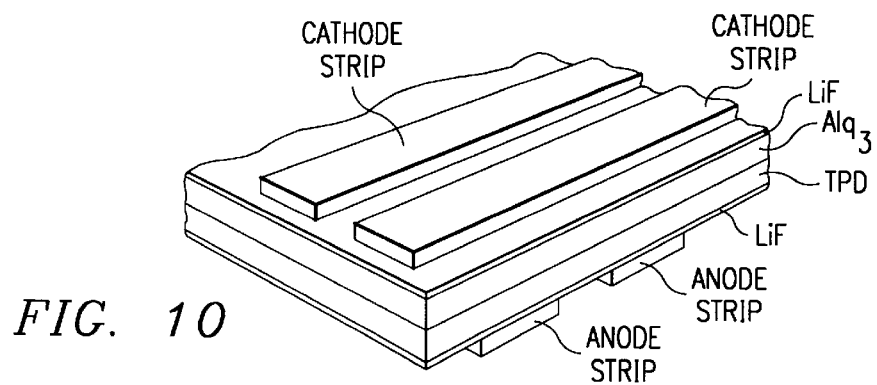
FIG. 10 illustrates and an array.

FIG. 10 shows in perspective view a 2 by 2 pixel portion of an array of preferred embodiment OLEDs arranged into rows and columns to serve as a display with each pixel being a white-light-emitting OLED or three OLEDs with one for each primary color. For passive addressing of the pixels, all of the anodes of the OLEDs in a row are connected together as an indium-tin oxide strip and all of the cathodes of the OLEDs in a column are connected together as a metal strip. This allows for passive addressing by applying about +3 volts to the rows (anode strips) sequentially and simultaneously applying about −3 volts to each of the columns (cathode strips) for pixel in the row to turn on. Other rows and columns are held at 0 volts, so only the selected pixels have more than 3 volts applied. For example, in an SVGA display of 1024 pixels in each of 768 rows, a row is active about 1/1000 of the time, so the average pixel brightness is about 1/1000 the peak brightness.

Figure 11:
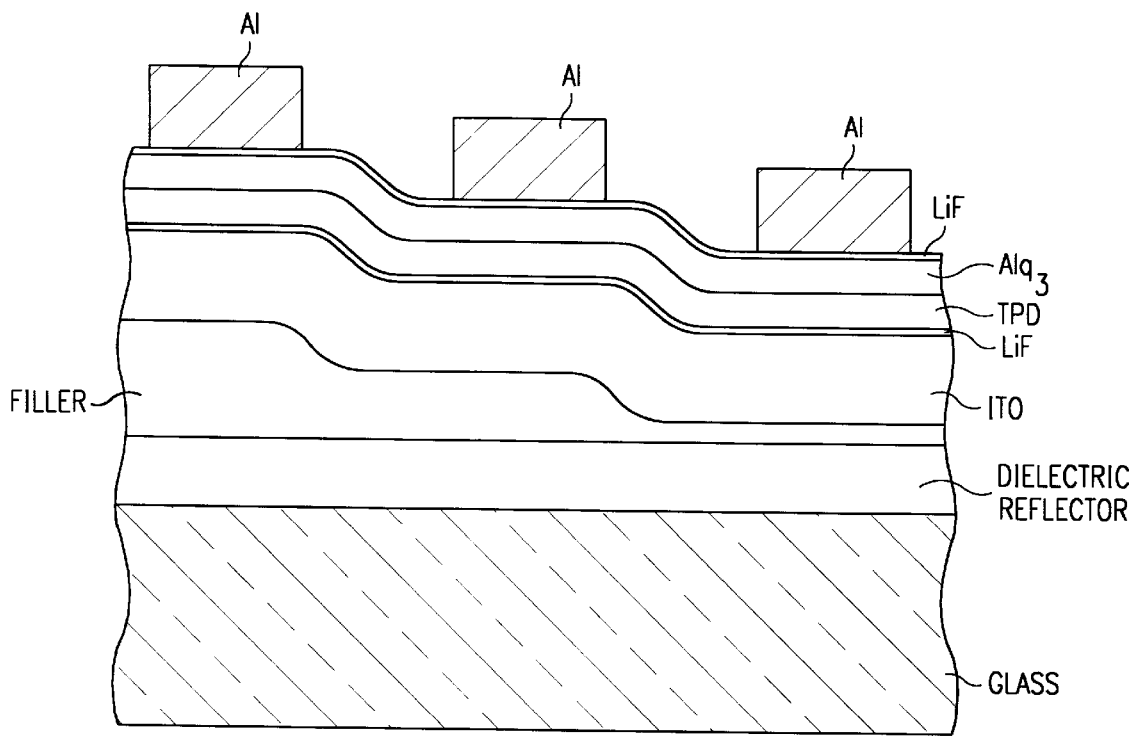
FIGS. 11–12 are cross sectional elevation views of further preferred embodiments.

Color pixels may be sets of three preferred embodiment OLEDs with three microcavity sizes for color selection; see FIG. 11 for a cross sectional elevation view. The patterned transparent filler layer determines cavity length (color) between dielectric reflector and the metal cathode.

Display applications for OLEDs are in small, portable, handheld devices.

Other applications of preferred embodiment OLEDs include as optocouplers and solid state relays in which a preferred embodiment OLED or preferred embodiment array of OLEDs has associated photodetectors attached directly to the glass substrate to detect the emitted light.

Polymer Preferred Embodiments

Figure 12:
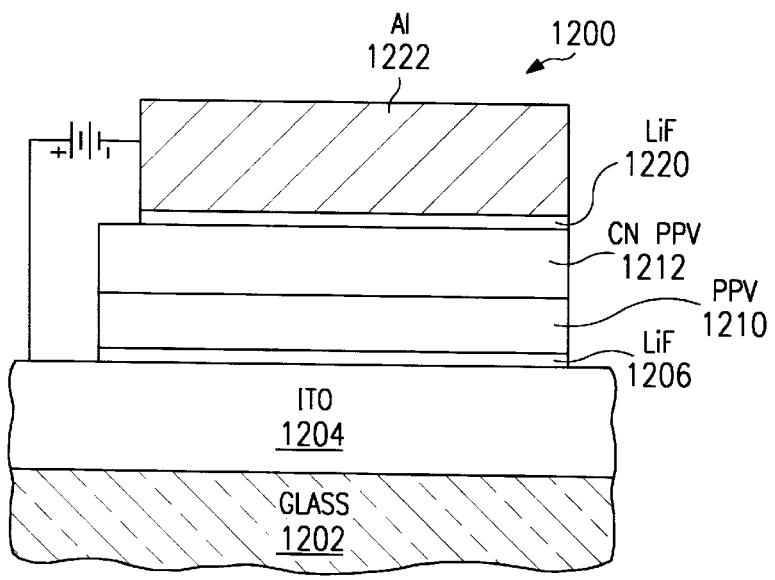

FIG. 12 illustrates in cross sectional elevation view polymer preferred embodiment OLED 1200 as including transparent (glass) substrate 1202, 120 nm thick indium-tin oxide anode layer 1204, 1.5 nm thick LiF dielectric layer 1206, 25 nm thick PPV hole transport layer 1210, 75 nm thick CN-PPV emissive layer 1212, 1.5 nm thick LiF dielectric layer 1220, and 200 nm thick aluminum cathode 1222. The CN-PPV provides electron transport. PPV is polyparaphenylene-vinylene and CN-PPV is cyano substituted PPV.

Polymer OLEDs may be fabricated by spin coating, spin casting, or melt techniques. These methods have the advantage of large area coverage and lower fabrication cost.

Modifications

The preferred embodiments can be modified in various ways while retaining the features of inorganic dielectrics at the anode-organic interface and optionally also at the cathode-organic interface.

For example, the OLED structure could be any one of the standard ones shown in Rothberg and Lovinger article; the hole transport material may be the emissive material and not the electron transport material.

The dielectric barriers could be different materials of high dielectric strength: the cathode barrier needs a high LUMO level and could be SiO$_2$, MgO, MgF$_2$, GeO$_2$, Al$_2$O$_3$ or other insulators. The anode barrier needs a low HOMO level and could be SiO$_2$, MgO, MgF$_2$, GeO$_2$, Al$_2$O$_3$ or other insulators. The barrier thickness could vary from 0.5 nm (approximately two atomic layers) to 5 nm; thicker barriers inhibit tunneling.

Further, alternative hole transport layer materials from the general class of oligomers of triarylamines and other compounds used as p-type transport materials in electrophotography and xerography could be used. Alternative electron transport and emissive materials from the general classes of luminescent metal chelates, organic laser dyes, and polyaromatic compounds could be used.

What is claimed is:

1. A light emitting diode, comprising:
   (a) an anode;
   (b) a hole transport layer on said anode, said hole transport layer including a first organic semiconductor material;

(c) an electron transport layer on said hole transport layer, said hole transport layer including a second organic semiconductor material;

(d) a cathode on said electron transport layer;

(e) wherein said anode includes a tunneling barrier at an interface with said hole transport layer.

2. The diode of claim 1, wherein:

(a) said cathode includes a tunneling barrier at an interface with said electron transport layer.

3. A light emitting diode, comprising:

(a) an anode;

(b) a cathode spaced from said anode; and (c) a layer of organic material between said anode and said cathode, said layer providing hole transport from said anode, electron transport from said cathode, and light emission;

(d) wherein said anode includes a tunneling barrier at an interface with said layer.

4. The diode of claim 3, wherein:

(a) said cathode includes a tunneling barrier at an interface with said layer.

5. The light emitting diode of claim 1, wherein:

(a) said tunneling barrier is made of LiF.

6. The light emitting diode of claim 2, wherein:

(a) said tunneling barrier in said anode is made of the same material as said tunneling barrier in said cathode.

7. The light emitting diode of claim 2, wherein:

(a) said tunneling barrier in said anode has the same thickness as said tunneling barrier in said cathode.

* * * * *